(12) United States Patent
Nagano et al.

(10) Patent No.: US 8,913,175 B2
(45) Date of Patent: Dec. 16, 2014

(54) SOLID-STATE IMAGE SENSING ELEMENT AND IMAGE SENSING APPARATUS FOR DETECTING A FOCUS STATE OF A PHOTOGRAPHING LENS

(75) Inventors: Akihiko Nagano, Ichihara (JP); Ichiro Onuki, Kawasaki (JP); Makoto Takamiya, Tokyo (JP); Makoto Oikawa, Yokohama (JP); Yoshitaka Hashimoto, Yokohama (JP); Fumihiro Kajimura, Kawasaki (JP); Yasuo Suda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 90 days.

(21) Appl. No.: 13/119,336
(22) PCT Filed: Nov. 11, 2009
(86) PCT No.: PCT/JP2009/069514
§ 371 (c)(1),
(2), (4) Date: Mar. 16, 2011
(87) PCT Pub. No.: WO2010/061756
PCT Pub. Date: Jun. 3, 2010

(65) Prior Publication Data
US 2011/0169997 A1 Jul. 14, 2011

(30) Foreign Application Priority Data
Nov. 27, 2008 (JP) ................................. 2008-302906

(51) Int. Cl.
H04N 5/225 (2006.01)
H01L 27/146 (2006.01)
H04N 9/04 (2006.01)
G02B 5/00 (2006.01)
H04N 5/369 (2011.01)
H04N 5/232 (2006.01)
G02B 5/20 (2006.01)
G02B 7/34 (2006.01)
G02B 3/00 (2006.01)

(52) U.S. Cl.
CPC .... *H01L 27/14627* (2013.01); *H01L 27/14623* (2013.01); *H04N 9/045* (2013.01); *G02B 5/005* (2013.01); *G02B 5/003* (2013.01); *H04N 5/3696* (2013.01); *H04N 5/23212* (2013.01); *G02B 5/201* (2013.01); *G02B 7/346* (2013.01); *G02B 3/0056* (2013.01)
USPC ............ 348/340; 348/273; 348/294; 348/345

(58) Field of Classification Search
USPC .................................. 348/273, 294, 340, 345
See application file for complete search history.

(56) References Cited

U.S. PATENT DOCUMENTS 4,410,804 A 10/1983 Stauffer .......................... 250/578
4,816,663 A 3/1989 Utagawa et al. ............... 250/201
(Continued)

FOREIGN PATENT DOCUMENTS

EP 0 981 245 A2 2/2000
JP 58-024105 A 2/1983
(Continued)

*Primary Examiner* — Usman Khan
(74) *Attorney, Agent, or Firm* — Fitzpatrick, Cella, Harper & Scinto

(57) ABSTRACT

An image sensor that output a signal for detecting a focus state of a photographing lens. The image sensor includes a microlens; a light-receiving pixel; a first focus state detection pixel pair for outputting a focus state detection signal, in which aperture areas of the first focus state detection pixel pair are small in comparison to the light-receiving pixel; and a second focus state detection pixel pair for outputting a focus state detection signal, in which aperture areas of the second focus state detection pixel pair are small in comparison to the light-receiving pixel, wherein the second focus state detection pixel pair is arranged at a position that is shifted by a predetermined amount relative to each aperture position, with respect to the microlens of the first focus state detection pixel pair.

7 Claims, 11 Drawing Sheets

(56) References Cited

U.S. PATENT DOCUMENTS

| | | | |
|---|---|---|---|
| 6,829,008 B1 | 12/2004 | Kondo et al. | 348/302 |
| 7,060,961 B2 | 6/2006 | Dobashi et al. | 250/216 |
| 7,245,324 B2 | 7/2007 | Namazue et al. | 348/340 |
| 7,488,923 B2 | 2/2009 | Kusaka | 250/201.2 |
| 2007/0237512 A1* | 10/2007 | Kusaka | 396/111 |
| 2008/0317454 A1 | 12/2008 | Onuki | |
| 2009/0200451 A1 | 8/2009 | Conners | |
| 2011/0063484 A1 | 3/2011 | Fujii et al. | |
| 2011/0096211 A1 | 4/2011 | Oikawa et al. | 348/273 |
| 2011/0096212 A1 | 4/2011 | Oikawa | 348/273 |

FOREIGN PATENT DOCUMENTS

| | | |
|---|---|---|
| JP | 59-133512 A | 7/1984 |
| JP | 62-229213 A | 10/1987 |
| JP | 5-127074 A | 5/1993 |
| JP | 2959142 B2 | 7/1999 |
| JP | 2000-156823 A | 6/2000 |
| JP | 2002-258142 A | 9/2002 |
| JP | 2005-106994 A | 4/2005 |
| JP | 2006-071656 A | 3/2006 |
| JP | 2006-208802 A | 8/2006 |
| JP | 2007-133087 A | 5/2007 |
| JP | 2007-155929 A | 6/2007 |
| JP | 2008-103885 A | 5/2008 |
| JP | 2008-147821 A | 6/2008 |
| JP | 2008-224801 A | 9/2008 |
| JP | 2009-015164 A | 1/2009 |
| JP | 2009-145527 A | 7/2009 |
| JP | 2009-204987 A | 9/2009 |
| WO | WO 2008/132812 A1 | 11/2008 |

* cited by examiner

FIG. 1

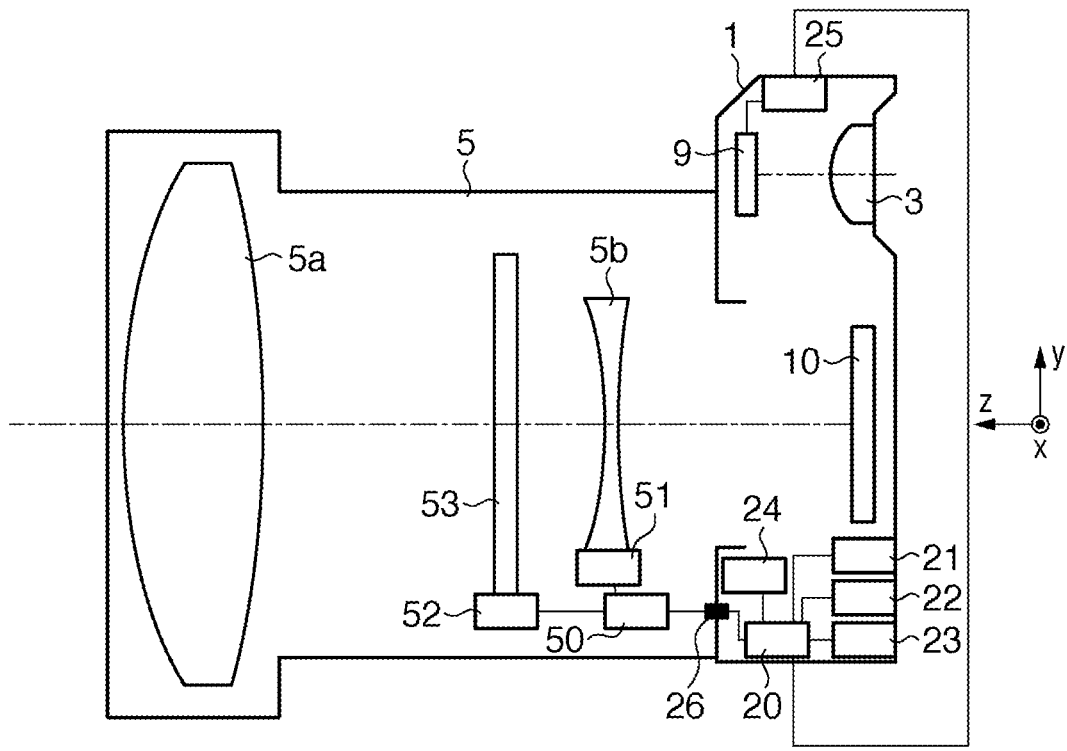

LEGEND:
1: CAMERA MAIN UNIT
3: OCULAR LENS
5: PHOTOGRAPHING LENS
5a: LENS
5b: LENS
9: LIQUID CRYSTAL DISPLAY ELEMENT
10: IMAGE SENSOR
20: CPU
21: IMAGE SENSOR CONTROL CIRCUIT
22: MEMORY CIRCUIT
23: INTERFACE CIRCUIT
24: IMAGE PROCESSING CIRCUIT
25: LIQUID CRYSTAL DISPLAY ELEMENT DRIVING CIRCUIT
26: ELECTRICAL CONTACT
50: LENS CPU
51: PHOTOGRAPHING LENS DRIVING MECHANISM
52: DIAPHRAGM DRIVING MECHANISM
53: DIAPHRAGM APPARATUS

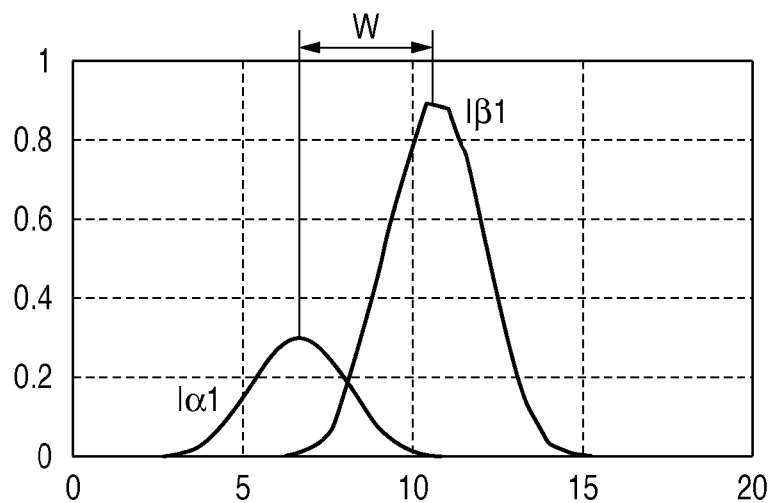
F I G. 6A
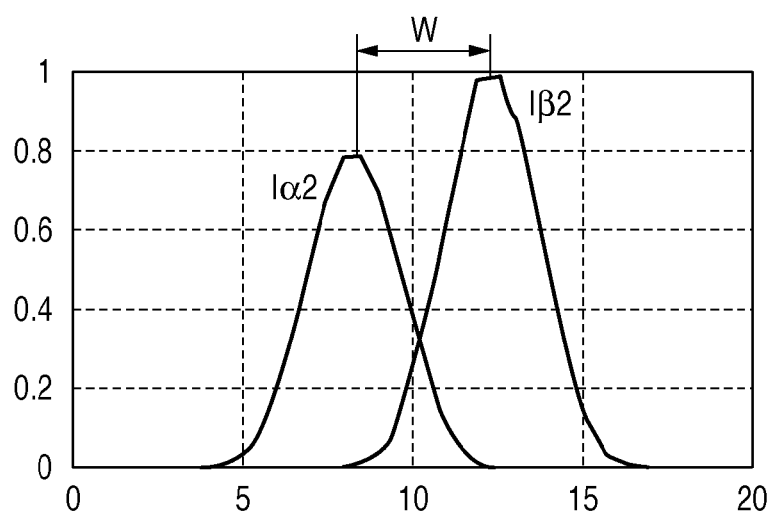
F I G. 6B
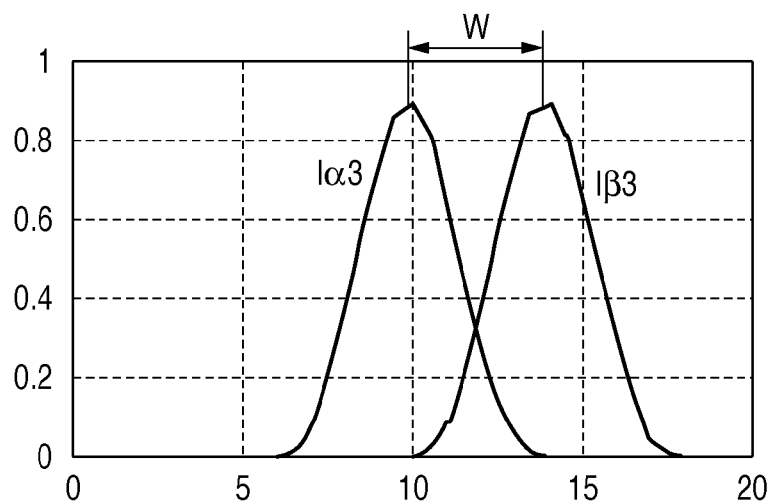
F I G. 6C

US 8,913,175 B2

SOLID-STATE IMAGE SENSING ELEMENT AND IMAGE SENSING APPARATUS FOR DETECTING A FOCUS STATE OF A PHOTOGRAPHING LENS

TECHNICAL FIELD

The present invention relates to a solid-state image sensing element and an image sensing apparatus, and more particularly to a solid-state image sensing element for performing imaging and an image sensing apparatus such as a digital still camera that is capable of detecting a focus state of a photographing lens based on an image that is obtained from the solid-state image sensing element.

BACKGROUND ART

There are several ways available that detect a focus state of a photographing lens in a digital camera that performs photographing using an image sensor. An apparatus disclosed in Japanese Patent Laid-Open No. 58-24105 is designed to perform focus state detection based on a pupil division method using a two-dimensional sensor having a microlens formed at each pixel on the sensor. According to the apparatus disclosed in Japanese Patent Laid-Open No. 58-24105, a photoelectric converter of each pixel of the image sensor is divided into a plurality of parts. The photoelectric converter that is divided in this manner is designed to receive light beams transmitted through different areas on a pupil of a photographing lens through a microlens.

Further, Japanese Patent No. 2959142 discloses a solid-state image sensing apparatus that also serves as an image sensor, in which pixels whose relative positions between a microlens and a photoelectric converter are shifted are arranged two-dimensionally. According to the solid-state image sensing apparatus disclosed in Japanese Patent No. 2959142, when detecting a focus state of a photographing lens, the focus state of the lens is detected based on images generated with pixel arrays that have different relative shift directions between a microlens and a photoelectric converter. In contrast, when imaging a normal image, an image is generated by adding pixels that have different relative shift directions between a microlens and a photoelectric converter.

The present applicant disclosed a solid-state image sensing apparatus that performs focus state detection based on a pupil division method using a CMOS-type image sensor (solid-state image sensing apparatus) that is used in a digital still camera in Japanese Patent Laid-Open No. 2005-106994. According to the solid-state image sensing apparatus disclosed in Japanese Patent Laid-Open No. 2005-106994, some pixels among a large number of pixels constituting the solid-state image sensing apparatus have a configuration in which a photoelectric converter for detecting a focus state of a photographing lens is divided into two sections. The photoelectric converter is designed to receive light beams transmitted through a predetermined area on a pupil of the photographing lens through a microlens.

FIG. 11 is an explanatory view concerning the distribution of received light of a pixel that performs focus state detection that is positioned at the center of the solid-state image sensing element disclosed in Japanese Patent Laid-Open No. 2005-106994, and shows areas on the pupil of the photographing lens which pass light that the two sections of the photoelectric converter divided into two parts can receive, respectively. The circle in the figure denotes an exit pupil of the photographing lens, and the white areas Sα and Sβ are areas which pass light that the photoelectric converter that is divided into two parts can receive. These areas are designed so as to be symmetric with respect to the optical axis of a normal photographing lens (point of intersection of x-axis and y-axis in the figure).

In the camera, a correlation operation is performed with respect to an image that is generated by light beams transmitted through the area Sα on the pupil of the photographing lens and an image that is generated by light beams transmitted through the area Sβ to detect a focus state of the photographing lens. A method that performs focus state detection by performing a correlation operation with respect to images generated by light beams transmitted through different pupil areas of a photographing lens is disclosed in Japanese Patent Laid-Open No. 5-127074.

In general, a CMOS-type solid-state image sensing element is manufactured by being subjected to multiple mask processes. Although the manufacturing is performed while alignment is performed between each mask process, misalignments occur between members manufactured at an initial stage and members manufactured at subsequent stages. That is, since a photoelectric converter of a solid-state image sensing element is formed at an initial stage of the manufacturing process and a microlens is formed at a final stage thereof, a misalignment often occurs between the photoelectric converter and the microlens.

FIG. 12A and FIG. 12B are views that illustrate the distribution of received light of a solid-state image sensing element on a pupil of a photographing lens. FIG. 12A shows the distribution on a light receiving area in a case in which there is a deviation from a designed value with respect to positions of photoelectric converters and a position of a microlens on a pixel that performs focus state detection in which a photoelectric converter is divided into two parts. In FIGS. 12A and 12B, a light receiving area Sα of one of the photoelectric converters and a light receiving area Sβ of the other photoelectric converter deviate in the −x direction with respect to the optical axis of the photographing lens (point of intersection of x-axis and y-axis in the figure).

When detecting a focus state of a photographing lens of a camera, normally focus state detection is possible not only with respect to a subject that is located in the center of the photographing screen, but also with respect to a subject located at the periphery of the photographing screen.

FIG. 12B is a view that describes the distribution of received light of a focus state detection pixel arranged at the periphery of a photographing screen, in a solid-state image sensing element in which the positions of photoelectric converters and the position of a microlens deviate from a designed value. Since vignetting of light beams by the lens frame of the photographing lens occurs at the periphery of the photographing screen, the light receiving area Sα corresponding to one of the photoelectric converters narrows as shown in FIG. 12B.

Consequently, the degree of agreement between an image generated by light beams transmitted through the area Sα on the pupil of the photographing lens and an image generated by light beams transmitted through the area Sβ decreases. As a result, even when a correlation operation is performed based on an image generated by light beams transmitted through the area Sα and an image generated by light beams transmitted through the area Sβ, there is the drawback that it is not possible to perform focus state detection with a high accuracy.

DISCLOSURE OF INVENTION

The present invention has been made in consideration of the above situation, and the invention enables focus state detection with a higher accuracy irrespective of manufacturing errors in a solid-state image sensing element.

According to the present invention, provided is a solid-state image sensing element that outputs a signal for detecting a focus state of a photographing lens, comprising: a microlens; a light-receiving pixel; a first focus state detection pixel pair for outputting a focus state detection signal, in which aperture areas of the first focus state detection pixel pair are small in comparison to the light-receiving pixel; and a second focus state detection pixel pair for outputting a focus state detection signal, in which aperture areas of the second focus state detection pixel pair are small in comparison to the light-receiving pixel, wherein the second focus state detection pixel pair is arranged at a position that is shifted by a predetermined amount relative to each aperture position, with respect to the microlens of the first focus state detection pixel pair.

Further, provided is an image sensing apparatus, comprising: the above solid-state image sensing element that is provided on a planned image forming plane of a photographing lens; a calculation unit configured to, based on the positions of light-receiving areas of the first and second focus state detection pixels in the respective pixels, the positions of the first and second focus state detection pixels in the solid-state image sensing element, and information on the photographing lens, calculate a ratio of an area on a pupil of the photographing lens corresponding to a light receiving area of one of the first focus state detection pixel pair to an area on the pupil of the photographing lens corresponding to a light receiving area of the other of the first focus state detection pixel pair, and a ratio of an area on a pupil of the photographing lens corresponding to a light receiving area of one of the second focus state detection pixel pair to an area on the pupil of the photographing lens corresponding to a light receiving area of the other of the second focus state detection pixel pair; a detection unit configured to detect a focus state using a signal that is output from a focus state detection pixel pair for which the ratio calculated by the calculation unit is within a predetermined range; and a control unit configured to control the photographing lens based on the focus state that is detected by the detection unit.

Further features of the present invention will become apparent from the following description of exemplary embodiments (with reference to the attached drawings).

BRIEF DESCRIPTION OF DRAWINGS

FIG. 1 is a view that shows the outline configuration of a digital camera according to a first embodiment of the present invention;

FIG. 6A to FIG. 6C are views that illustrate examples of line image distribution charts generated by outputs of a focus state detection pixel group according to the first embodiment of the present invention;

BEST MODE FOR CARRYING OUT THE INVENTION

Figure 2:
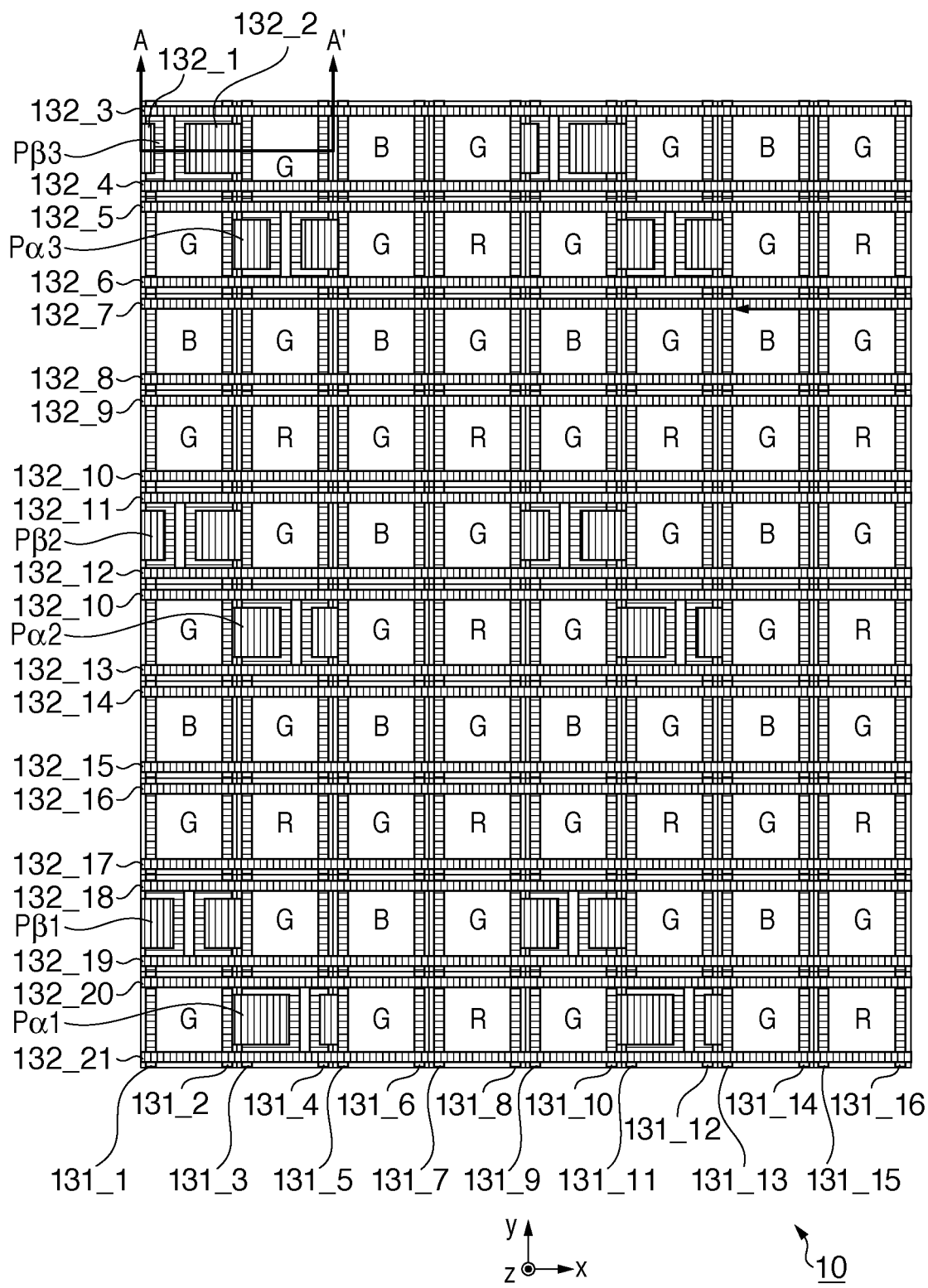
FIG. 2 is a partial plan view of an image sensor according to the first embodiment of the present invention.

Preferred embodiments of the present invention will be described in detail in accordance with the accompanying drawings.

First Embodiment

FIG. 1 is a view that shows a brief configuration of a digital camera as an example of an image sensing apparatus according to the first embodiment.

A digital camera shown in FIG. 1 mainly includes a camera main unit 1 and a photographing lens 5 that is detachable from the camera main unit 1. First, the configuration of the camera main unit 1 will be described.

Reference numeral 10 denotes an image sensor (solid-state image sensing element) comprising a plurality of pixels that is disposed on a planned image forming plane of the photographing lens 5. Reference numeral 20 denotes a CPU that controls the entire camera. Reference numeral 21 denotes an image sensor control circuit that controls driving of the image sensor 10. The CPU 20 also calculates a focus state of the photographing lens 5. Reference numeral 24 denotes an image processing circuit that performs image processing of image signals picked up by the image sensor 10. Reference numeral 25 denotes a liquid crystal display element driving circuit that drives a liquid crystal display element 9 that displays an image that has undergone image processing. Reference numeral 3 denotes an ocular lens 3 for observing a subject image that is displayed by the liquid crystal display element 9. Reference numeral 22 denotes a memory circuit that records images picked up by the image sensor 10. Reference numeral 23 denotes an interface circuit for outputting an image that has undergone image processing at the image processing circuit 24 to the outside of the camera. The memory circuit 22 is configured to be able to also record a distribution of received light of the image sensor 10.

Next, the configuration of the photographing lens 5 will be described.

Reference numerals 5a and 5b denote lenses. Although in this case two lens 5a and 5b are illustrated for the purpose of convenience, in actuality the photographing lens 5 includes a large number of lenses. The photographing lens 5 receives focus adjustment information that is sent from the CPU 20 of the camera main unit 1 with a lens CPU 50 through an electrical contact 26, and adjusts an in-focus state using a photographing lens driving mechanism 51 based on the focus adjustment information. Reference numeral 53 denotes a diaphragm apparatus that is disposed in the vicinity of a pupil of the photographing lens 5. The diaphragm apparatus 53 is configured to be narrowed to a predetermined diaphragm value by a diaphragm driving mechanism 52.

FIG. 2 is a partial plan view of the image sensor 10.

In FIG. 2, reference numerals 131 and 132 denote electrodes. An area defined by first electrodes 131 and 132 represents a single pixel. The characters "R", "G", and "B" that are written in respective pixels denote the hue of a color filter of the respective pixel. In a pixel in which the character "R" is written, the color filter transmits a red light component, in a pixel in which the character "G" is written, the color filter transmits a green light component, and in a pixel in which the character "B" is written, the color filter transmits a blue light component. Further, the respective pixels in which the character "R", "G", or "B" is written are configured so as to receive light of the entire pupil area of the photographing lens 5.

When the array of color filters is a Bayer array, pixels are arranged so that "R" and "G" pixels and "B" and "G" pixels are alternately disposed. In the image sensor 10 according to this first embodiment, focus state detection pixels that receive light beams transmitted through a pupil area of one part of the photographing lens 5 are assigned to some positions where an "R" or a "B" pixel ought to be. In the figure, reference characters Pα1, Pβ1, Pα2, Pβ2, Pα3, and Pβ3 denote pixels for detecting a focus state of the photographing lens 5. In these pixels, an aperture in the x direction is limited by the first electrode 131 (light shielding member).

With regard to the pixels for focus state detection that are disposed at parts of the image sensor 10 of the first embodiment, five different kinds of pixels are designed in which an aperture center position within a pixel in the x direction of the aperture that is limited by the first electrode 131 is symmetric with respect to the pixel center.

For example, for the focus state detection pixel Pα1 in which an aperture that is defined by an electrode 131_3 and an electrode 131_4 is shifted in the +x direction with respect to the pixel center, a focus state detection pixel having a similar electrode aperture is disposed at a position adjacent to a fourth pixel in the x direction. Further, the focus state detection pixel Pβ1 in which an aperture that is defined by an electrode 131_1 and an electrode 131_2 approximately matches the pixel center is disposed at a position that is diagonally adjacent to the focus state detection pixel Pα1. Furthermore, with respect to the focus state detection pixel Pβ1, a focus state detection pixel having a similar electrode aperture is disposed at a position that is adjacent to a fourth pixel in the x direction.

The CPU 20 generates a first focus state detection image from a focus state detection pixel group having the same electrode aperture as the focus state detection pixel Pα1, and similarly generates a second focus state detection image from a focus state detection pixel group having the same electrode aperture as the focus state detection pixel Pβ1. Further, the CPU 20 detects the focus state of the photographing lens 5 in an area in which the focus state detection pixels Pα1 and Pβ1 are located by performing a correlation operation based on the first focus state detection image and the second focus state detection image.

Similarly, the CPU 20 generates a third focus state detection image from a focus state detection pixel group having the same electrode aperture as the focus state detection pixel Pα2. The CPU 20 likewise generates a fourth focus state detection image from a focus state detection pixel group having an electrode aperture that is the same as the focus state detection pixel Pβ2. Further, the CPU 20 detects a focus state of the photographing lens 5 in the area that the focus state detection pixels Pα2 and Pβ2 are located by performing a correlation operation based on the third focus state detection image and the fourth focus state detection image.

Similarly, the CPU 20 generates a fifth focus state detection image from a focus state detection pixel group having the same electrode aperture as the focus state detection pixel Pα3. The CPU 20 also generates a sixth focus state detection image from a focus state detection pixel group having the same electrode aperture as the focus state detection pixel Pβ3. Further, the CPU 20 detects a focus state of the photographing lens 5 in an area in which the focus state detection pixels Pα3 and Pβ3 are located by performing a correlation operation based on the fifth focus state detection image and the sixth focus state detection image.

The CPU 20 then averages the focus states of the photographing lens 5 in the area in which the focus state detection pixels Pα1 and Pβ1 are located, the area in which the focus state detection pixels Pα2 and Pβ2 are located, and the area in which the focus state detection pixels Pα3 and Pβ3 are located. The CPU 20 sends focus adjustment information to the photographing lens driving mechanism 51 based on the focus state detection result to perform focus adjustment of the photographing lens 5.

In contrast, when imaging a normal image, the CPU 20 deals with the focus state detection pixels in which the electrode aperture of the pixel is limited as defective pixels, and interpolates image signals corresponding to the focus state detection pixels with image signals output from pixels located at the peripheries of the focus state detection pixels.

Figure 3:
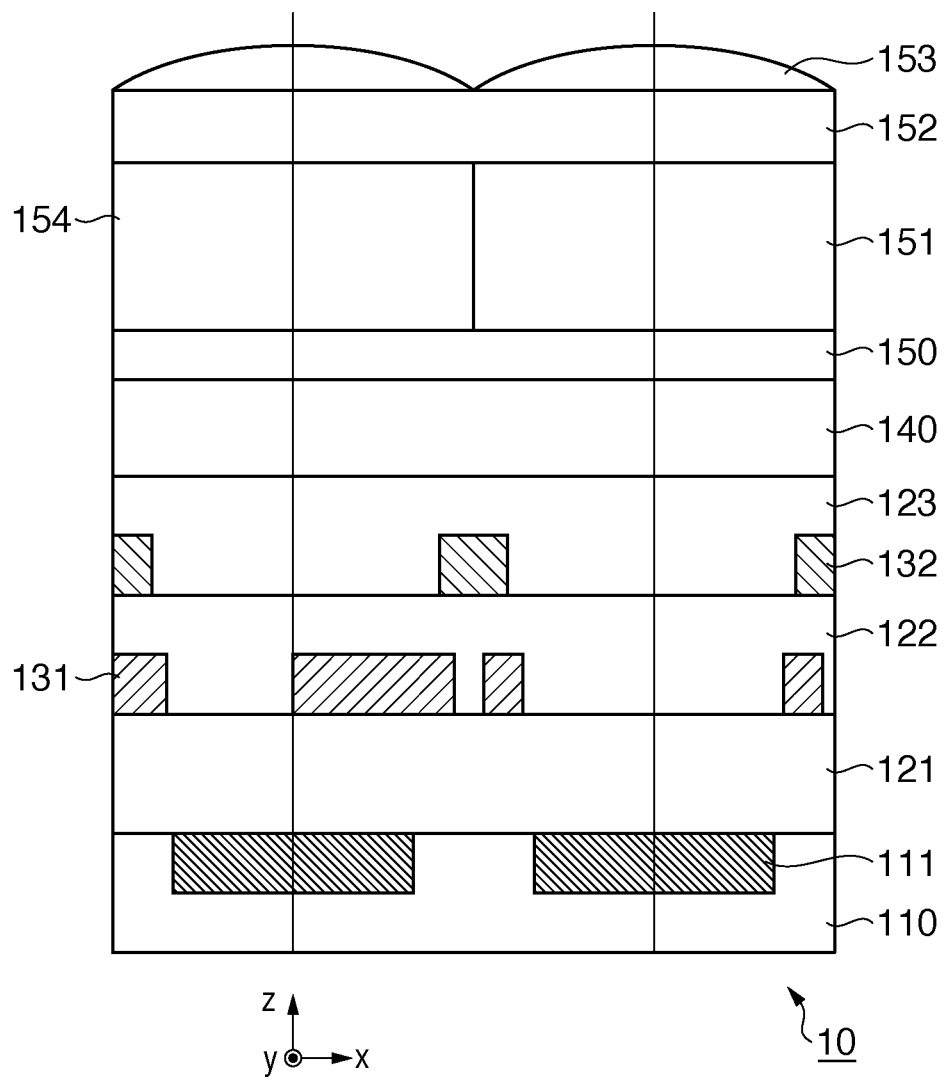
FIG. 3 is a sectional view of a portion of the image sensor shown in FIG. 2.

FIG. 3 is a sectional view along a plane A-A' of the image sensor 10 shown in FIG. 2.

The pixel on the right side of FIG. 3 represents a normal imaging pixel that is capable of receiving light beams transmitted through the entire pupil area of the photographing lens 5. The pixel on the left side of FIG. 3 represents a focus state detection pixel that is capable of receiving light beams transmitted through a part of the pupil area of the photographing lens 5.

As shown in FIG. 3, a photoelectric converter 111 is formed inside a silicon substrate 110. A signal charge that is generated with the photoelectric converter 111 is output to the outside through an unshown floating diffusion portion, the first electrode 131, and the second electrode 132. An interlayer dielectric film 121 is formed between the photoelectric converter 111 and the first electrode 131. An interlayer dielectric film 122 is formed between the first electrode 131 and the second electrode 132. An interlayer dielectric film 123 is formed on an incident light side of the second electrode 132, and a passivation film 140 and a planarized layer 150 are formed thereon. A color filter layer 151 or a transparent filter layer 154, a planarized layer 152, and a microlens 153 are formed on the incident light side of the planarized layer 150. In this case, the power of the microlens 153 is designed so that the pupil of the photographing lens 5 and the photoelectric converter 111 become substantially conjugate with each other. In a pixel positioned at the center of the image sensor 10, the microlens 153 is disposed at the center of the pixel. In a pixel positioned at a periphery of the image sensor 10, the microlens 153 is disposed in a condition in which the microlens 153 is shifted to the optical axis side of the photographing lens 5.

Subject light transmitted through the photographing lens 5 is condensed in the vicinity of the image sensor 10. Further, light that arrives at each pixel of the image sensor 10 is refracted by the microlens 153 and is condensed to the photoelectric converter 111. In the pixel on the right side that is used for normal imaging, the first electrode 131 and the second electrode 132 are arranged so as not to prevent the transmittance of incident light.

In contrast, in the focus state detection pixel on the left side, a part of the first electrode 131 is arranged so as to cover the photoelectric converter 111. As a result, the focus state detection pixel on the left side is capable of receiving light beams transmitted through a part of the pupil of the photographing lens 5. Further, in order to prevent the output of the photoelectric converter 111 decreasing because the first electrode 131 blocks a part of incident light beams, the transparent filter layer 154 of the focus state detection pixel is formed with a resin with a high transmissivity that does not absorb light.

Focus state detection pixels arranged at a part of the image sensor 10 of the first embodiment are configured so as to vary the distribution of received light of the photographing lens 5 by varying positions of the microlens 153 and relative positions of the aperture centers of the first electrodes 131.

Figure 4:
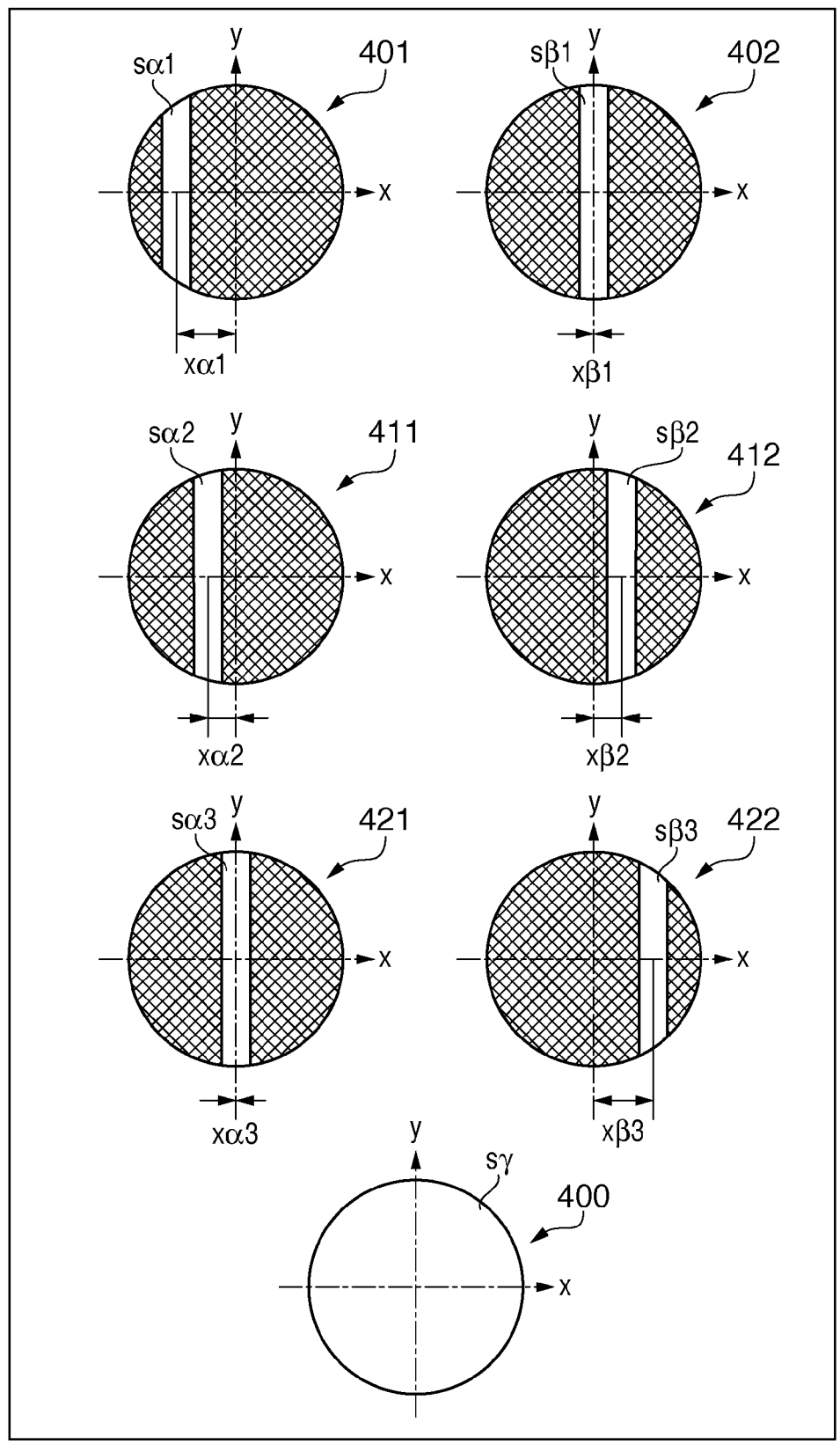
FIG. 4 is a view that illustrates an example of the designed distribution of received light on a pupil of a photographing lens of a focus state detection pixel that is arranged at a part of the image sensor according to the first embodiment of the present invention.

FIG. 4 is a view that illustrates examples of the designed distribution of received light on the pupil of the photographing lens 5 of focus state detection pixels arranged at a part of the image sensor 10.

In FIG. 4, reference numeral 401 denotes the designed distribution of received light on the pupil of the photographing lens 5 of the focus state detection pixel Pα1 shown in the partial plan view of the image sensor 10 in FIG. 2. The center of an aperture defined by the electrode 131_3 and electrode 131_4 of the focus state detection pixel Pα1 is shifted significantly in the +x direction with respect to the center of the pixel. Therefore, the center of an area Sα1, that is capable of receiving light (referred to as "light receiving area Sα1" hereinafter), of the photoelectric converter of the focus state detection pixel Pα1 is shifted by the amount of a distance −xα1 with respect to the optical axis (point of intersection of x-axis and y-axis in the figure) on the x-axis on the exit pupil of the photographing lens 5.

Reference numeral 402 denotes the designed distribution of received light on the pupil of the photographing lens 5 of the focus state detection pixel Pβ1 shown in the partial plan view of the image sensor 10 in FIG. 2. The center of an aperture defined by the electrode 131_1 and electrode 131_2 of the focus state detection pixel Pβ1 approximately matches the center of the pixel. Therefore, the center of an area Sβ1, that is capable of receiving light (referred to as "light receiving area Sβ1" hereinafter), of the photoelectric converter of the focus state detection pixel Pβ1 approximately matches the optical axis (point of intersection of x-axis and y-axis in the figure) on the x-axis in the figure on the exit pupil of the photographing lens 5.

Reference numeral 411 denotes the designed distribution of received light on the pupil of the photographing lens 5 of the focus state detection pixel Pα2 shown in the partial plan view of the image sensor 10 in FIG. 2. The center of an aperture defined by the electrode 131_3 and electrode 131_4 of the focus state detection pixel Pα2 is shifted by a predetermined amount in the +x direction with respect to the center of the pixel. Therefore, the center of an area Sα2, that is capable of receiving light (referred to as "light receiving area Sα2" hereinafter), of the photoelectric converter of the focus state detection pixel Pα2 is shifted by the amount of a distance −xα2 with respect to the optical axis (point of intersection of x-axis and y-axis in the figure) on the x-axis in the figure on the exit pupil of the photographing lens 5.

Reference numeral 412 denotes the designed distribution of received light on the pupil of the photographing lens 5 of the focus state detection pixel Pβ2 shown in the partial plan view of the image sensor 10 in FIG. 2. The center of an aperture defined by the electrode 131_1 and electrode 131_2 of the focus state detection pixel Pβ2 is shifted by a predetermined amount in the −x direction with respect to the center of the pixel. Therefore, the center of an area Sβ2, that is capable of receiving light (referred to as "light receiving area Sβ2" hereinafter), of the photoelectric converter of the focus state detection pixel Pβ2 is shifted by a distance xβ2 with respect to the optical axis (point of intersection of x-axis and y-axis in the figure) on the x-axis in the figure on the exit pupil of the photographing lens 5.

Reference numeral 421 denotes the designed distribution of received light on the pupil of the photographing lens 5 of the focus state detection pixel Pα3 shown in the partial plan view of the image sensor 10 in FIG. 2. The center of an aperture defined by the electrode 131_3 and electrode 131_4 of the focus state detection pixel Pα3 approximately matches the center of the pixel. Therefore, the center of an area Sα3, that is capable of receiving light (referred to as "light receiving area Sα3" hereinafter), of the photoelectric converter of the focus state detection pixel Pα3 approximately matches the optical axis (point of intersection of x-axis and y-axis in the figure) on the x-axis in the figure on the exit pupil of the photographing lens 5. In this case, the designed distribution of received light on the pupil of the photographing lens 5 of the focus state detection pixel Pα3 approximately matches the designed distribution of received light on the pupil of the photographing lens 5 of the focus state detection pixel Pβ1.

Reference numeral 422 denotes the designed distribution of received light on the pupil of the photographing lens 5 of the focus state detection pixel Pβ3 shown in the partial plan view of the image sensor 10 in FIG. 2. The center of an aperture defined by the electrode 131_1 and electrode 131_2 of the focus state detection pixel Pβ3 is shifted significantly in the −x direction with respect to the center of the pixel. Therefore, the center of an area Sβ3, that is capable of receiving light (referred to as "light receiving area Sα3" hereinafter), of the photoelectric converter of the focus state detection pixel Pβ3 is shifted by a distance xβ3 with respect to the optical axis (point of intersection of x-axis and y-axis in the figure) on the x-axis in the figure on the exit pupil of the photographing lens 5.

Reference numeral 400 denotes the designed distribution of received light on the pupil of the photographing lens 5 of a normal imaging pixel shown in the partial plan view of the image sensor 10 in FIG. 2. The electrode 131 of the normal imaging pixel is configured so as not to block the transmittance of light to the photoelectric converter. Hence, the photoelectric converter of the normal imaging pixel can receive light beams transmitted through an entire pupil area Sγ of the photographing lens 5. The center of the area Sγ that is capable of receiving light of the normal imaging pixel in this case approximately matches the optical axis (point of intersection of x-axis and y-axis in the figure) on the exit pupil of the photographing lens 5.

As described above, the image sensor 10 according to this first embodiment comprises seven kinds of pixel groups in which the centers of distribution of received light are present at different positions on the x-axis.

Figure 5:
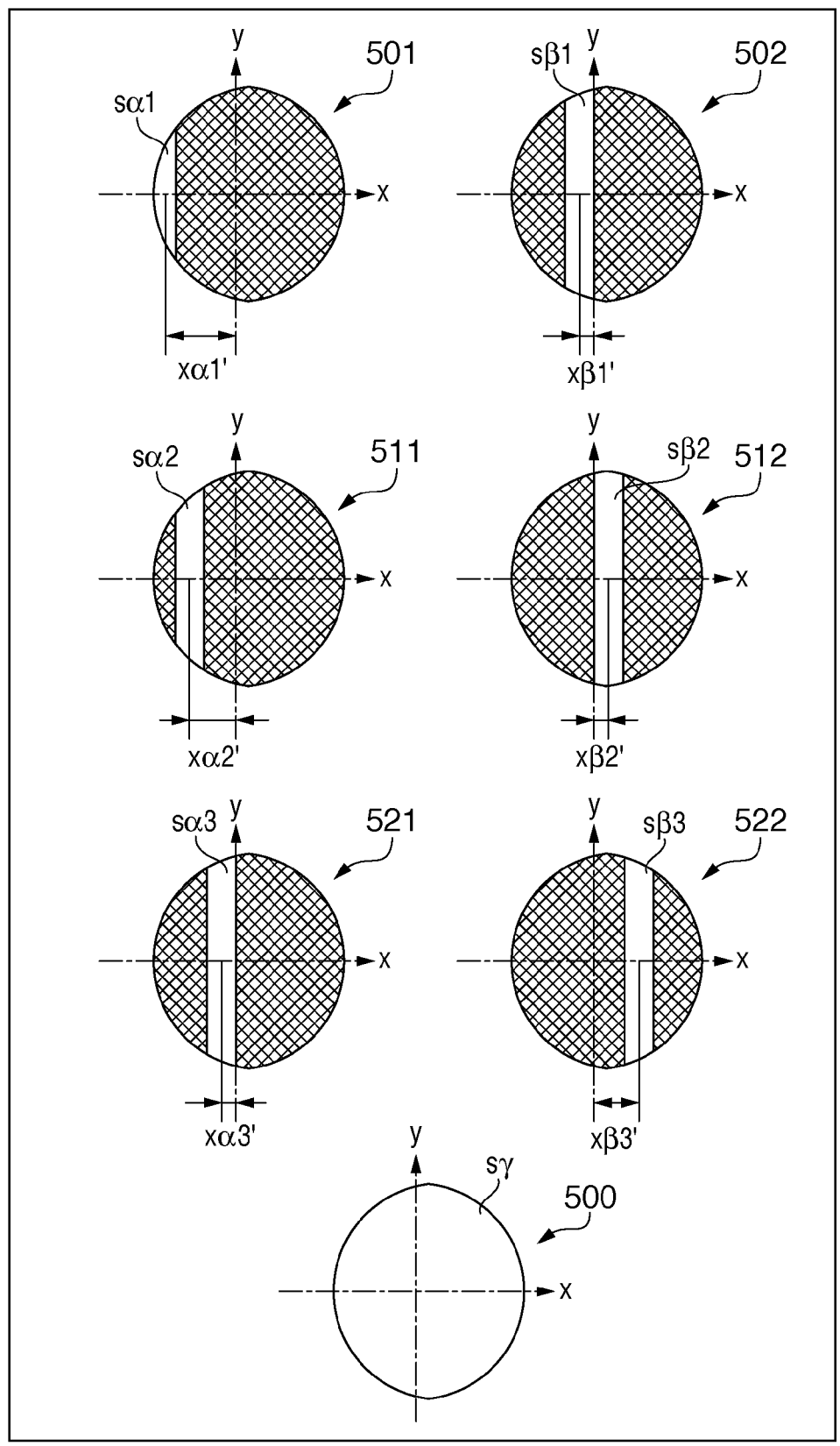
FIG. 5 is a view that illustrates an example of the distribution of received light on a pupil of a photographing lens of a focus state detection pixel that is arranged at a part of an image sensor in which there is a misalignment between a microlens and a first electrode according to the first embodiment of the present invention.

FIG. 5 is an explanatory view concerning the distribution of received light on the pupil of the photographing lens 5 of focus state detection pixels positioned at the periphery of a photographing screen. The focus state detection pixels are disposed at a part of the image sensor 10 in which there is a misalignment between the microlens 153 and the first electrode 131. FIG. 6A to FIG. 6C are line image distribution charts that are generated with signals from a focus state detection pixel group. FIG. 5 shows the distribution of received light of a focus state detection pixel group positioned in the −x direction with respect to the center of the image sensor 10 in a case in which, with respect to the first electrode 131, the microlens 153 of the image sensor 10 is misaligned in the −x direction from the design value. The distribution of received light of the individual focus state detection pixels of the image sensor 10 is stored in the memory circuit 22.

When the microlens 153 is misaligned in the −x direction from a design value with respect to the first electrode 131, the distribution of received light of the focus state detection pixels of the image sensor 10 shifts uniformly in the −x direction on the pupil of the photographing lens 5. Further, in a focus state detection pixel group that is positioned in the −x direction with respect to the center of the image sensor 10, light beams are vignetted from the −x direction side in the figure by the lens frame of the photographing lens 5.

In FIG. 5, reference numeral 501 denotes the distribution of received light on the pupil of the photographing lens 5 of the focus state detection pixel P$\alpha$1 shown in the partial plan view of the image sensor 10 in FIG. 2. The center of an aperture of the focus state detection pixel P$\alpha$1 defined by the electrode 131_3 and electrode 131_4, that is, the center of the light receiving area S$\alpha$1 of the photoelectric converter of the focus state detection pixel P$\alpha$1, is shifted significantly in the +x direction with respect to the center of the pixel. Accordingly, the center of the light receiving area S$\alpha$1 is shifted by a distance −x$\alpha$1' further in the −x direction with respect to the optical axis (point of intersection of x-axis and y-axis in the figure) on the exit pupil of the photographing lens 5. Further, since light beams are vignetted from the −x direction side in the figure by the lens frame of the photographing lens 5, an area that is capable of receiving light of the focus state detection pixel P$\alpha$1 becomes narrower.

Reference numeral 502 denotes the distribution of received light on the pupil of the photographing lens 5 of the focus state detection pixel P$\beta$1 shown in the partial plan view of the image sensor 10 in FIG. 2. The center of an aperture of the focus state detection pixel P$\beta$1 defined by the electrode 131_1 and electrode 131_2, that is, the center of the light receiving area S$\beta$1 of the photoelectric converter of the focus state detection pixel P$\beta$1, approximately matches the center of the pixel. Accordingly, the center of the area S$\beta$1 is shifted by a distance −x$\beta$1' in the −x direction with respect to the optical axis (point of intersection of x-axis and y-axis in the figure) on the exit pupil of the photographing lens 5.

FIG. 6A shows a line image distribution I$\alpha$1 that is generated with signals from a focus state detection pixel group represented by the focus state detection pixel P$\alpha$1, and a line image distribution I$\beta$1 that is generated with signals from a focus state detection pixel group represented by the focus state detection pixel P$\beta$1. Because the surface area of the light receiving area S$\alpha$1 on the pupil of the photographing lens 5 of the focus state detection pixel P$\alpha$1 and the surface area of the light receiving area S$\beta$1 on the pupil of the photographing lens 5 of the focus state detection pixel P$\beta$1 differ significantly, there is a large difference in output between the line image distribution I$\alpha$1 and the line image distribution I$\beta$1. As a result, even if detection of the focus state of the photographing lens 5 is performed using a focus state detection image generated with signals from the focus state detection pixel group represented by the focus state detection pixel P$\alpha$1 and a focus state detection image generated with signals from the focus state detection pixel group represented by the focus state detection pixel P$\beta$1, focus state detection cannot be performed with a high accuracy.

Therefore, according to the first embodiment, the distribution of received light on the pupil of the photographing lens 5 of the focus state detection pixel groups represented by the focus state detection pixels P$\alpha$1 and P$\beta$1, respectively, is estimated based on the distribution of received light of the individual focus state detection pixels, information regarding positions of the focus state detection pixels on the image sensor 10, and information of the photographing lens 5. The CPU 20 then judges whether or not focus state detection can be accurately performed based on images generated with the given focus state detection pixel groups. For example, the CPU 20 calculates a ratio between the surface area of the light receiving area S$\alpha$1 on the pupil of the photographing lens 5 corresponding to the focus state detection pixel P$\alpha$1 and the surface area of the light receiving area S$\beta$1 on the pupil of the photographing lens 5 corresponding to the focus state detection pixel P$\beta$1. Further, a configuration is adopted such that, focus state detection is performed using images obtained from focus state detection pixel groups having a surface area ratio within a predetermined range, and not performed using images obtained from focus state detection pixel groups having a surface area ratio outside the range (for example, two times or more or one half or less). According to the first embodiment, a ratio between the surface area of the light receiving area S$\alpha$1 on the pupil of the photographing lens 5 of the focus state detection pixel P$\alpha$1 and the surface area of the light receiving area S$\beta$1 on the pupil of the photographing lens 5 of the focus state detection pixel P$\beta$1 is approximately ⅓. Consequently, the CPU 20 does not execute focus state detection based on images obtained from the focus state detection pixel groups represented by the focus state detection pixels P$\alpha$1 and P$\beta$1.

Reference numeral 511 in FIG. 5 denotes the distribution of received light on the pupil of the photographing lens 5 of the focus state detection pixel P$\alpha$2 shown in the partial plan view of the image sensor 10 in FIG. 2. The center of an aperture of the focus state detection pixel P$\alpha$2 defined by the electrode 131_3 and electrode 131_4, that is, the center of the light receiving area S$\alpha$2 of the photoelectric converter of the focus state detection pixel P$\alpha$2, is shifted by a predetermined amount in the +x direction with respect to the center of the pixel. Accordingly, the center of the area S$\alpha$2 is shifted by a distance −x$\alpha$2' further in the −x direction with respect to the optical axis (point of intersection of x-axis and y-axis in the figure) on the exit pupil of the photographing lens 5. Further, since light beams are vignetted from the −x direction side in the figure by the lens frame of the photographing lens 5, an light receiving area of the focus state detection pixel P$\alpha$2 becomes narrower.

Reference numeral 512 denotes the distribution of received light on the pupil of the photographing lens 5 of the focus state detection pixel P$\beta$2 shown in the partial plan view of the image sensor 10 in FIG. 2. The center of an aperture of the focus state detection pixel P$\beta$2 defined by the electrode 131_1 and electrode 131_2, that is, the center of the light receiving area S$\beta$2 of the photoelectric converter of the focus state detection pixel P$\beta$2, is shifted by a predetermined amount in the −x direction with respect to the center of the pixel.

Accordingly, the center of the light receiving area Sβ2 is shifted by a distance xβ2' further in the −x direction with respect to the optical axis (point of intersection of x-axis and y-axis in the figure) on the exit pupil of the photographing lens 5.

FIG. 6B shows a line image distribution Iα2 that is generated with signals from a focus state detection pixel group represented by the focus state detection pixel Pα2, and a line image distribution Iβ2 that is generated with signals from a focus state detection pixel group represented by the focus state detection pixel Pβ2. Because the surface area of the light receiving area Sα2 on the pupil of the photographing lens 5 of the focus state detection pixel Pα2 and the surface area of the light receiving area Sβ2 on the pupil of the photographing lens 5 of the focus state detection pixel Pβ2 differ somewhat, a difference in output arises to some extent between the line image distribution Iα2 and the line image distribution Iβ2.

Therefore, according to the first embodiment, the distribution of received light on the pupil of the photographing lens 5 of the focus state detection pixel groups represented by the focus state detection pixels Pα2 and Pβ2, respectively, is estimated based on the distribution of received light of the individual focus state detection pixels, information regarding positions of the focus state detection pixels on the image sensor 10, and information of the photographing lens 5. The CPU 20 then judges whether or not focus state detection can be accurately performed based on images generated with the given focus state detection pixel groups. For example, the CPU 20 calculates a ratio between the surface area of the light receiving area Sα2 on the pupil of the photographing lens 5 of the focus state detection pixel Pα2 and the surface area of the light receiving area Sβ2 on the pupil of the photographing lens 5 of the focus state detection pixel Pβ2. Further, a configuration is adopted such that, focus state detection is performed using images obtained from focus state detection pixel groups having a surface area ratio within a predetermined range and not performed using images obtained from focus state detection pixel groups having a surface area ratio outside the range (for example, two times or more or one half or less). According to the first embodiment, a ratio between the surface area of the light receiving area Sα2 on the pupil of the photographing lens 5 of the focus state detection pixel Pα2 and the surface area of the light receiving area Sβ2 on the pupil of the photographing lens 5 of the focus state detection pixel Pβ2 is approximately ⅘. Consequently, the CPU 20 performs focus state detection based on images obtained with signals from the focus state detection pixel groups represented by the focus state detection pixels Pα2 and Pβ2. At this time, for the images obtained with signals from the focus state detection pixel groups represented by the focus state detection pixels Pα2 and Pβ2, the CPU 20 performs gain correction based on the surface area ratio for the light receiving areas on the pupil of the photographing lens 5 that is previously obtained, thereby improving the focus state detection accuracy.

In FIG. 5, reference numeral 521 denotes the distribution of received light on the pupil of the photographing lens 5 of the focus state detection pixel Pα3 shown in the partial plan view of the image sensor 10 in FIG. 2. The center of an aperture of the focus state detection pixel Pα3 defined by the electrode 131_3 and electrode 131_4, that is, the center of the light receiving area Sα3 of the photoelectric converter of the focus state detection pixel Pα3, approximately matches the center of the pixel. Accordingly, the center of the light receiving area Sα3 is shifted by a distance −xα3' in the −x direction with respect to the optical axis (point of intersection of x-axis and y-axis in the figure) on the exit pupil of the photographing lens 5. Further, since light beams are vignetted from the −x direction side in the figure by the lens frame of the photographing lens 5, an area that is capable of receiving light of the focus state detection pixel Pα3 becomes narrower. In this case, the distribution of received light on the pupil of the photographing lens 5 of the focus state detection pixel Pα3 approximately matches the distribution of received light on the pupil of the photographing lens 5 of the focus state detection pixel Pβ1.

Reference numeral 522 denotes the distribution of received light on the pupil of the photographing lens 5 of the focus state detection pixel Pβ3 shown in the partial plan view of the image sensor 10 in FIG. 2. The center of an aperture of the focus state detection pixel Pβ3 defined by the electrode 131_1 and electrode 131_2, that is, the center of the light receiving area Sβ3 of the photoelectric converter of the focus state detection pixel Pβ3, is shifted significantly in the −x direction with respect to the center of the pixel. Accordingly, the center of the light receiving area Sβ3 is shifted by a distance xβ3' further in the −x direction with respect to the optical axis (point of intersection of x-axis and y-axis in the figure) on the exit pupil of the photographing lens 5.

FIG. 6C shows a line image distribution Iα3 that is generated with signals from a focus state detection pixel group represented by the focus state detection pixel Pα3, and a line image distribution Iβ3 that is generated with signals from a focus state detection pixel group represented by the focus state detection pixel Pβ3. Because the surface area of the light receiving area Sα3 on the pupil of the photographing lens 5 of the focus state detection pixel Pα3 and the surface area of the light receiving area Sβ3 on the pupil of the photographing lens 5 of the focus state detection pixel Pβ3 are approximately the same, the outputs of the line image distribution Iα3 and the line image distribution Iβ3 are approximately the same.

Therefore, according to the first embodiment, the distribution of received light on the pupil of the photographing lens 5 of the focus state detection pixel groups represented by the focus state detection pixels Pα3 and Pβ3, respectively, is estimated based on the distribution of received light of the individual focus state detection pixels, information regarding positions of the focus state detection pixels on the image sensor 10, and information of the photographing lens 5. The CPU 20 then judges whether or not focus state detection can be accurately performed based on images generated with the given focus state detection pixel groups. For example, the CPU 20 calculates a ratio between the surface area of the light receiving area Sα3 on the pupil of the photographing lens 5 of the focus state detection pixel Pα3 and the surface area of the light receiving area Sβ3 on the pupil of the photographing lens 5 of the focus state detection pixel Pβ3. Further, a configuration is adopted such that focus state detection is performed using images obtained from focus state detection pixel groups having a surface area ratio within a predetermined range and not performed using images obtained from focus state detection pixel groups having a surface area ratio outside the range (for example, two times or more or one half or less). According to the first embodiment, a ratio between the surface area of the light receiving area Sα3 on the pupil of the photographing lens 5 of the focus state detection pixel Pα3 and the surface area of the light receiving area Sβ3 on the pupil of the photographing lens 5 of the focus state detection pixel Pβ3 is approximately 1. Consequently, the CPU 20 performs focus state detection based on images obtained with the focus state detection pixel groups represented by the focus state detection pixels Pα3 and Pβ3.

In FIG. 5, reference numeral 500 denotes the distribution of received light on the pupil of the photographing lens 5 of a normal imaging pixel shown in the partial plan view of the image sensor 10 in FIG. 2. The first electrode 131 of the normal imaging pixel is configured so as not to block the transmittance of light to the photoelectric converter. Hence, the photoelectric converter of the normal imaging pixel can receive light beams transmitted through the entire pupil area Sγ of the photographing lens 5. However, because light beams from the −x direction side in the figure are vignetted by the lens frame of the photographing lens 5, an area that is capable of receiving light becomes narrower.

According to the first embodiment as described above, the CPU 20 judges whether or not there is a large degree of polarization in the distribution of received light of a focus state detection pixel due to misalignment between the microlens 153 and the first electrode 131 comprising the image sensor 10 and whether or not there is a large degree of vignetting caused by the lens frame of the photographing lens 5. Based on the judgment result, the CPU 20 selects focus state detection pixel groups used to perform focus state detection. The CPU 20 according to the first embodiment averages a focus state of the photographing lens 5 in an area in which the focus state detection pixels Pα2 and Pβ2 are located and a focus state of the photographing lens 5 in an area in which the focus state detection pixels Pα3 and Pβ3 are located. Further, the CPU 20 sends focus adjustment information to the photographing lens driving mechanism 51 based on the focus state detection result, and performs focus adjustment of the photographing lens 5.

Figure 7:
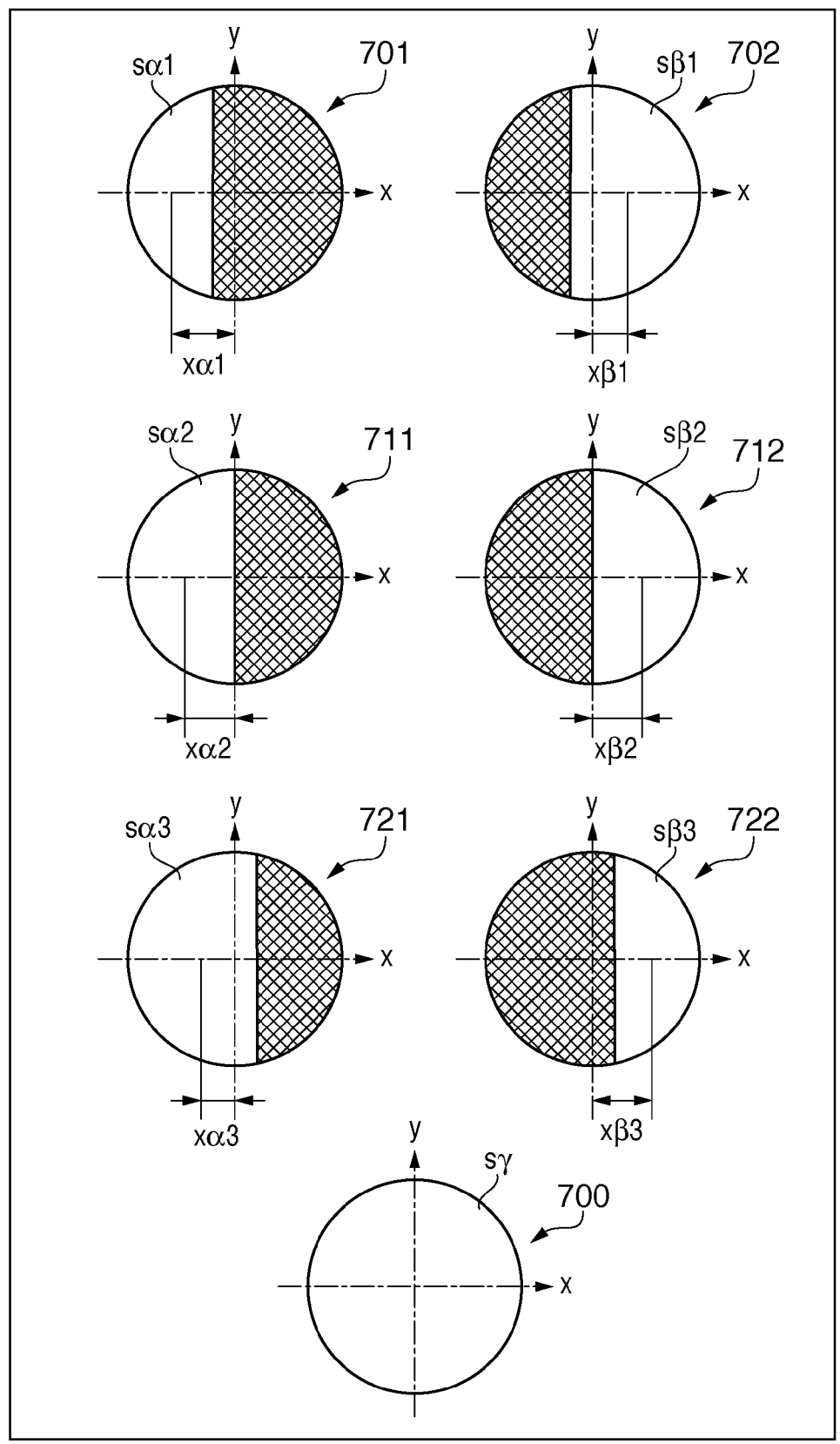
FIG. 7 is a view that illustrates another example of the distribution of received light on a pupil of a photographing lens of a focus state detection pixel that is arranged at a part of an image sensor in which there is a misalignment between a microlens and a first electrode according to the first embodiment of the present invention.

According to the first embodiment an example is described in which the shape of distribution of received light of the image sensor 10 on the pupil of the photographing lens 5 is a slit shape. However, as shown in views illustrating examples of the distribution of received light of the image sensor that are denoted by reference numerals 701 to 722 in FIG. 7, a configuration may also be adopted in which the pupil area of the photographing lens 5 is divided into two parts, and the centers of the light receiving areas are different. For example, as shown in FIG. 7, the image sensor 10 may comprise seven kinds of pixel groups in which the centers of distribution of received light exist at different positions on the x-axis. In this connection, reference numeral 700 denotes the distribution of received light on the pupil of the photographing lens 5 of a normal imaging pixel shown in the partial plan view of the image sensor 10 in FIG. 2.

Second Embodiment

Next, a second embodiment of the present invention will be described. The outline configuration of a digital camera according to this second embodiment is similar to the digital camera described with reference to FIG. 1 in the foregoing first embodiment. Hence a description thereof is omitted here.

Figure 8:
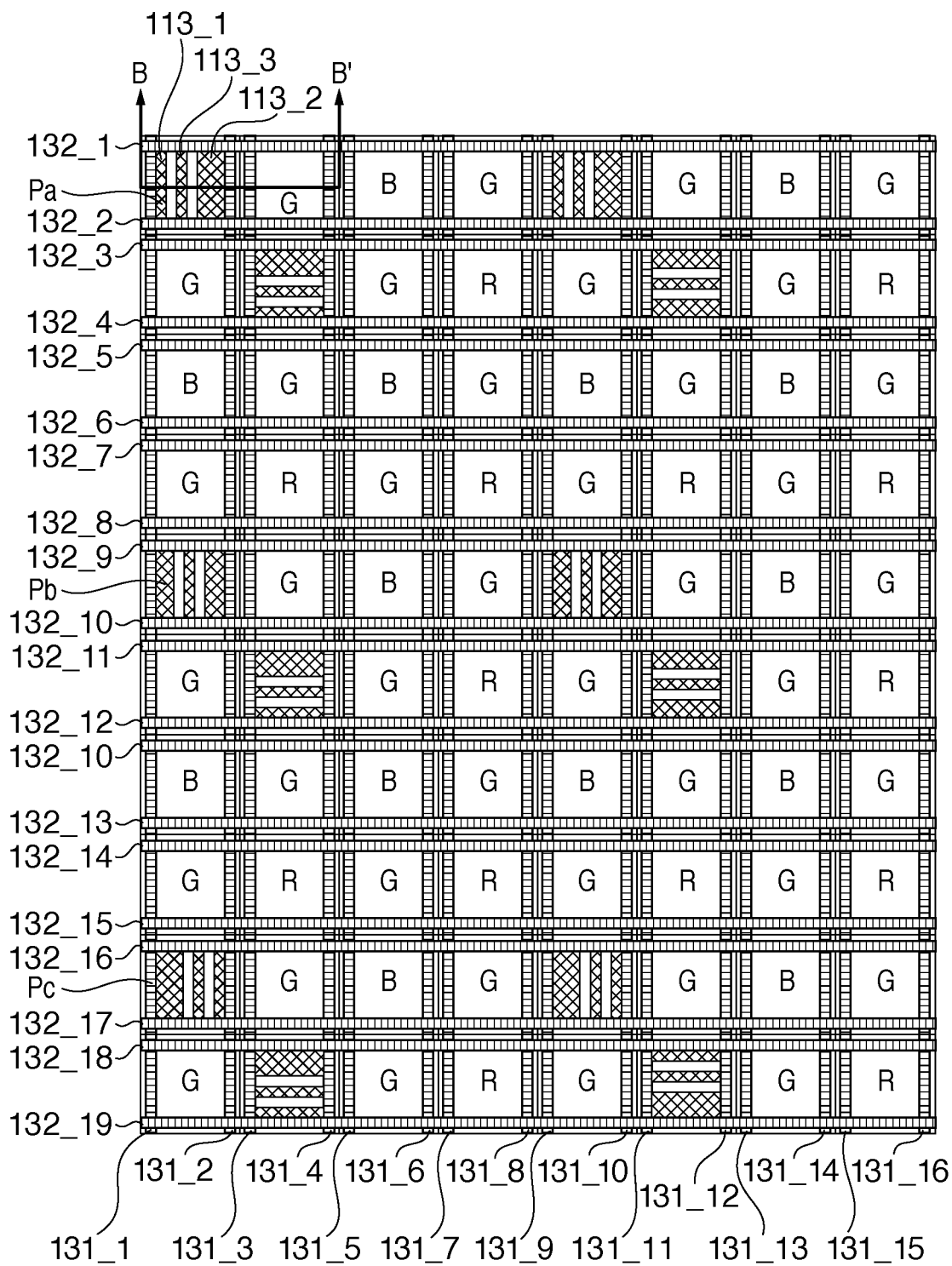
FIG. 8 is a partial plan view of an image sensor according to a second embodiment of the present invention.

FIG. 8 is a partial plan view of the image sensor 10 according to the second embodiment.

In FIG. 8, reference numerals 131 and 132 denote electrodes. Reference numerals Pa, Pb, and Pc denote focus state detection pixels that are configured so as to limit a light receiving area that receives light beams transmitted through the pupil of the photographing lens 5 by covering the photoelectric converter 111 with a light shielding member 113 such as tungsten. In this connection, the pixel Pa is a first focus state detection pixel, in which the white areas in the figure represent a pair of light receiving areas of the first focus state detection pixel. The pixel Pb is a third focus state detection pixel, in which the white areas in the figure represent a pair of light receiving areas of the third focus state detection pixel. The pixel Pc is a second focus state detection pixel, in which the white areas in the figure represent a pair of light receiving areas of the second focus state detection pixel. As shown in FIG. 8, the pairs of light receiving areas of the first to third focus state detection pixels are arranged at positions in which the pairs of light receiving areas are mutually shifted by a predetermined amount inside the relevant pixels. Further, the adopted configuration is such that it is possible to independently read respective signals obtained by photoelectric conversion from each area of the pair of light receiving areas.

According to this second embodiment, a focus state detection pixel group that divides the pupil of the photographing lens in the x direction and a focus state detection pixel group that divides the pupil of the photographing lens 5 in the y direction are provided. Hereinafter, a description is given that relates to focus state detection pixels that divide the pupil of the photographing lens 5 in the x direction.

Figure 9:
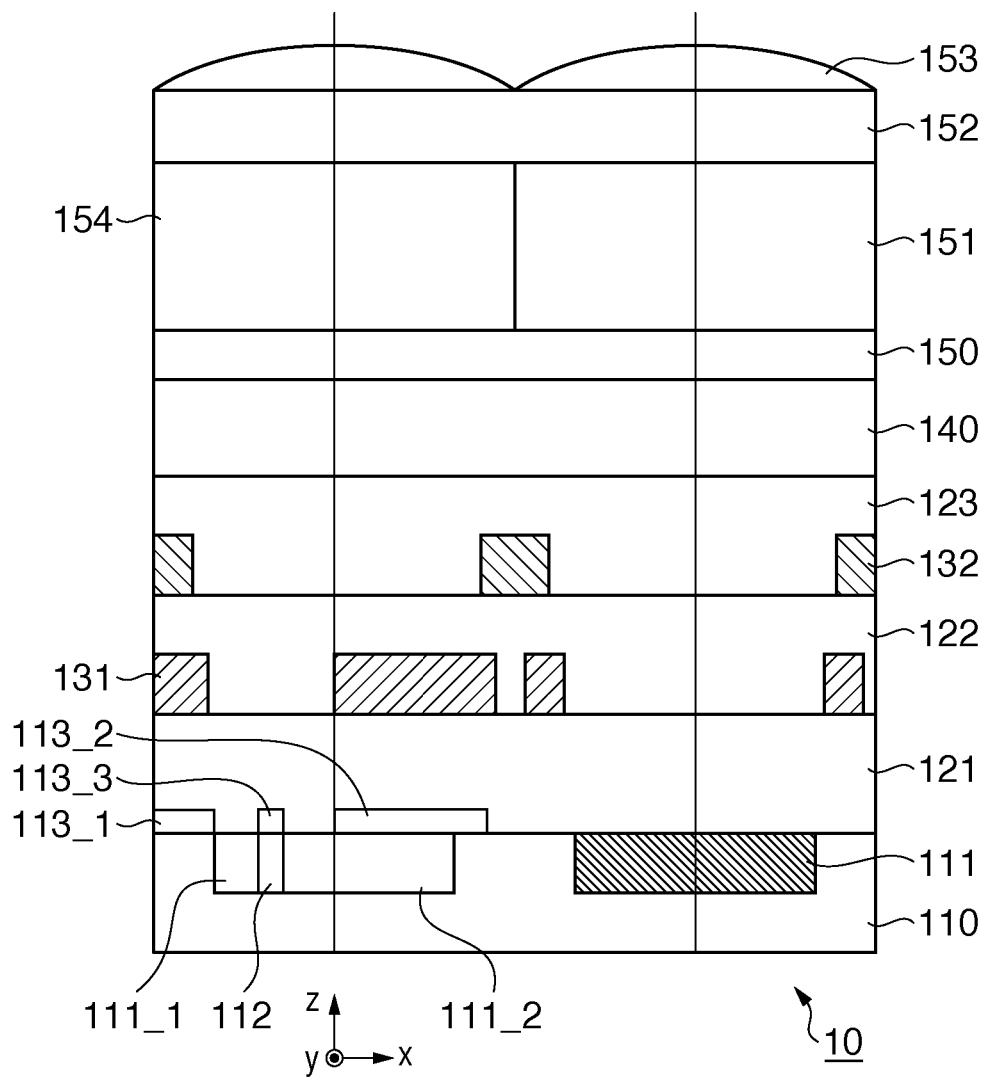
FIG. 9 is a sectional view of a portion of the image sensor shown in FIG. 8.

FIG. 9 is a sectional view along a B-B' plane of the image sensor 10 shown in FIG. 8.

The pixel on the right side of FIG. 9 represents a normal imaging pixel that is capable of receiving light beams transmitted through the entire pupil area of the photographing lens 5. The pixel on the left side of FIG. 9 represents a focus state detection pixel that is capable of receiving light beams from a pupil area of one part of the photographing lens 5. In FIG. 9, components that serve the same function as components shown in FIG. 3 are denoted by the same reference numbers.

As shown in FIG. 9, a photoelectric converter 111 is formed inside a silicon substrate 110. A signal charge that is generated at the photoelectric converter 111 is output to the outside through an unshown floating diffusion portion, the first electrode 131, and the second electrode 132. An interlayer dielectric film 121 is formed between the photoelectric converter 111 and the first electrode 131. An interlayer dielectric film 122 is formed between the first electrode 131 and the second electrode 132. An interlayer dielectric film 123 is formed on an incident light side of the second electrode 132, and a passivation film 140 and a planarized layer 150 are formed thereon. A color filter layer 151 or a transparent filter layer 154, a planarized layer 152, and a microlens 153 are formed on the incident light side of the planarized layer 150. In this case, the power of the microlens 153 is designed so that the pupil of the photographing lens 5 and the photoelectric converter 111 become substantially conjugate with each other.

Subject light transmitted through the photographing lens 5 is condensed in the vicinity of the image sensor 10. Further, light that arrives at each pixel of the image sensor 10 is refracted by the microlens 153 and is condensed to the photoelectric converter 111. In this case, the first electrode 131 and second electrode 132 are designed so as not to block the transmittance of incident light.

In the focus state detection pixel on the left side in the drawing that is dealt with as a defective pixel at a time of normal imaging, the photoelectric converter 111 is divided with an oxide film layer 112 into a first photoelectric converter 111_1 and a second photoelectric converter 111_2. Further, light shielding layers 113_1 to 113_3 are formed with tungsten on an incident light side of the photoelectric converter 111_2. As a result, the photoelectric converter 111_1 and the photoelectric converter 111_2 of the focus state detection pixel on the left side in the figure can receive light beams transmitted through a part of the pupil of the photographing lens 5. Further, in order to prevent the output from the photoelectric converter 111 of the focus state detection pixel decreasing, the transparent filter layer 154 of the focus state detection pixel is formed with a resin with a high transmissivity that does not absorb light.

Figure 10:
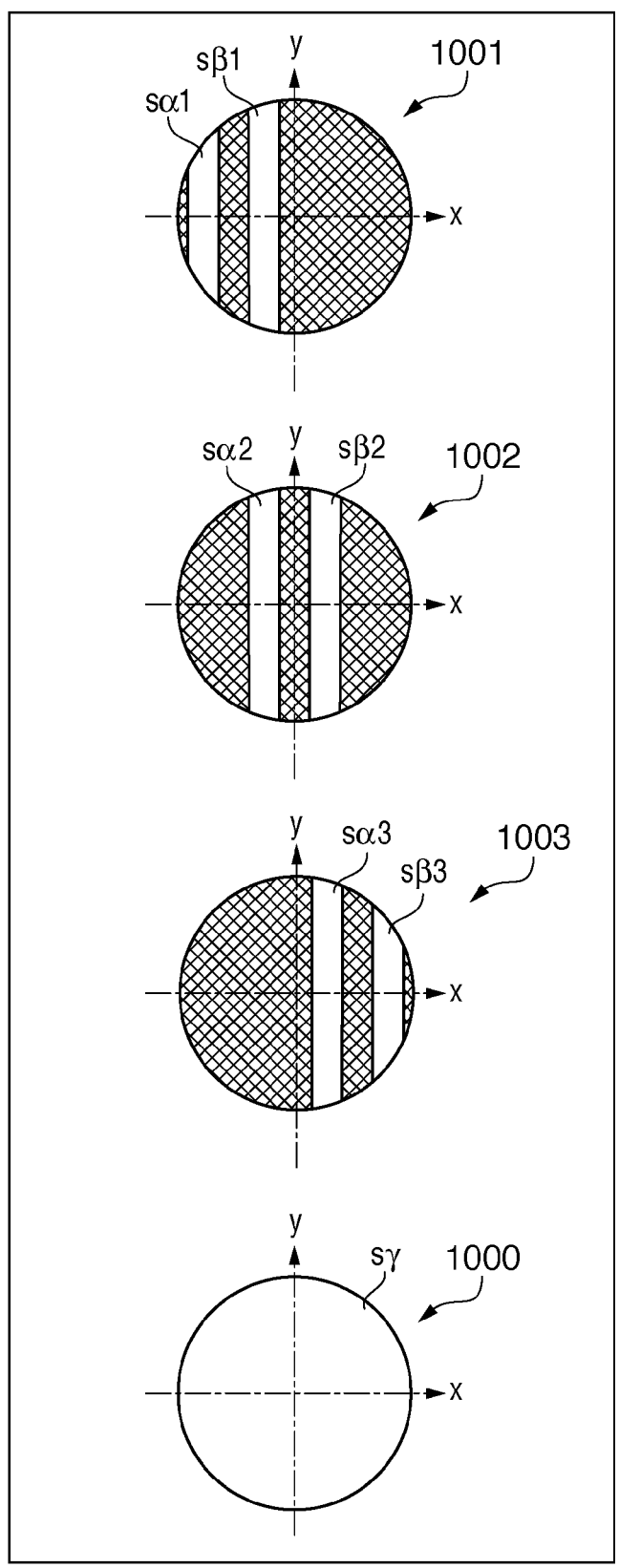
FIG. 10 is a view that illustrates an example of the distribution of received light on a pupil of a photographing lens of a focus state detection pixel that is arranged at a part of an image sensor in which there is a misalignment between a microlens and a first electrode according to the second embodiment of the present invention.
Figure 11:
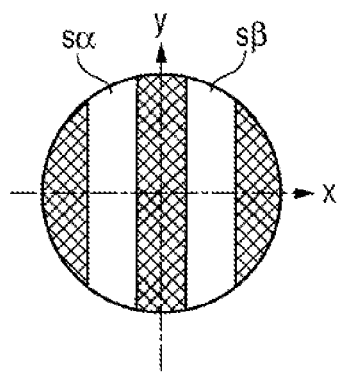
FIG. 11 is a view that illustrates an example of the distribution of received light of a conventional solid-state image sensing element.
Figure 12A:
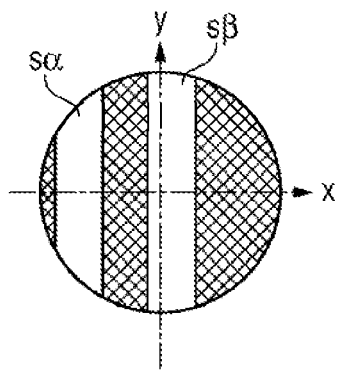
FIG. 12A and FIG. 12B are views that illustrate another example of the distribution of received light of a conventional solid-state image sensing element.
Figure 12B:
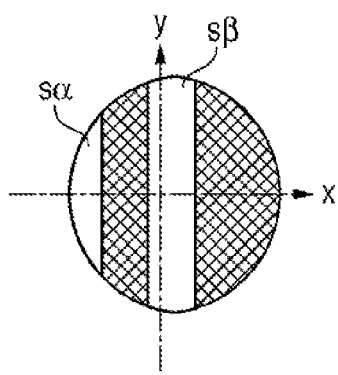

FIG. 10 is a view that illustrates the designed distribution of received light on the pupil of the photographing lens 5 of a focus state detection pixel provided at one part of the image sensor 10. According to this second embodiment, the photoelectric converters of the focus state detection pixels have any one of the four kinds of distribution of received light illustrated in FIG. 10.

In FIG. 10, reference numeral 1001 denotes a designed distribution of received light on the pupil of the photographing lens 5 of the focus state detection pixel Pc shown in the partial plan view of the image sensor 10 in FIG. 8. The center of gravity of aperture parts of the photoelectric converters that have been divided into two of the focus state detection pixel Pc is shifted in the +x direction with respect to the center of the pixel. Consequently, the center of gravity of an light receiving area $S\alpha 1$ of the first photoelectric converter and an light receiving area $S\beta 1$ of the second photoelectric converter of the focus state detection pixel Pc are shifted in the -x direction with respect to the optical axis (point of intersection of x-axis and y-axis in the figure) on the exit pupil of the photographing lens.

For example, it is assumed that because of a manufacturing error the microlens 153 is misaligned in the +x direction with respect to the photoelectric converter 111 with regard to the design value. In this case, the light receiving area $S\alpha 1$ of the first photoelectric converter of the focus state detection pixel Pc on the pupil of the photographing lens 5 and the light receiving area $S\beta 1$ of the second photoelectric converter shift in the +x direction with respect to the design value. As a result, the center of gravity of the light receiving area $S\alpha 1$ of the first photoelectric converter and the light receiving area $S\beta 1$ of the second photoelectric converter shifts towards the optical axis of the photographing lens 5. Hence, the correlation between two focus state detection images output from the two photoelectric converters is enhanced and the focus state detection accuracy increases.

Reference numeral 1002 denotes a designed distribution of received light on the pupil of the photographing lens 5 of the focus state detection pixel Pb shown in the partial plan view of the image sensor 10 in FIG. 8. The center of gravity of aperture parts of the photoelectric converters that have been divided into two of the focus state detection pixel Pb approximately matches the center of the pixel. Consequently, the center of gravity of an light receiving area $S\alpha 2$ of the first photoelectric converter and an light receiving area $S\beta 2$ of the second photoelectric converter of the focus state detection pixel Pb approximately match the optical axis (point of intersection of x-axis and y-axis in the figure) on the exit pupil of the photographing lens. In this case, the light receiving area $S\beta 1$ of the second photoelectric converter of the focus state detection pixel Pc and the light receiving area $S\alpha 2$ of the first photoelectric converter of the focus state detection pixel Pb are approximately matching.

For example, it is assumed that because of a manufacturing error the microlens 153 is misaligned with respect to the photoelectric converter 111 with regard to the design value. In such case, the light receiving area $S\alpha 2$ of the first photoelectric converter of the focus state detection pixel Pb on the pupil of the photographing lens 5 and the light receiving area $S\beta 2$ of the second photoelectric converter shift with respect to the design value. Although the center of gravity of the light receiving area $S\alpha 2$ of the first photoelectric converter and the light receiving area $S\beta 2$ of the second photoelectric converter shifts from the optical axis of the photographing lens and the surface area ratio between the light receiving areas $S\alpha 2$ and $S\beta 2$ also changes, the change in the surface area ratio is small. As a result, although there is a decline in the correlativity between two focus state detection images that are output from the two photoelectric converters, it is possible to perform focus state detection using the two focus state detection images.

Reference numeral 1003 denotes a designed distribution of received light on the pupil of the photographing lens 5 of the focus state detection pixel Pa shown in the partial plan view of the image sensor 10 in FIG. 8. The center of gravity of aperture parts of the photoelectric converters that have been divided into two of the focus state detection pixel Pa is shifted in the -x direction with respect to the center of the pixel. Consequently, the center of gravity of an light receiving area $S\alpha 3$ of the first photoelectric converter and an light receiving area $S\beta 3$ of the second photoelectric converter of the focus state detection pixel Pa are shifted in the +x direction with respect to the optical axis (point of intersection of x-axis and y-axis in the figure) on the exit pupil of the photographing lens 5. In this case, the light receiving area $S\beta 2$ of the second photoelectric converter of the focus state detection pixel Pb and the light receiving area $S\alpha 3$ of the first photoelectric converter of the focus state detection pixel Pa are approximately matching.

For example, it is assumed that because of a manufacturing error the microlens 153 is misaligned in the -x direction with respect to the photoelectric converter 111 with regard to the design value. In such case, the light receiving area $S\alpha 3$ of the first photoelectric converter of the focus state detection pixel Pa on the pupil of the photographing lens 5 and the light receiving area $S\beta 3$ of the second photoelectric converter shift in the -x direction with respect to the design value. As a result, the center of gravity of the light receiving area $S\alpha 3$ of the first photoelectric converter and the light receiving area $S\beta 3$ of the second photoelectric converter shifts towards the optical axis of the photographing lens 5. Hence, the correlativity between two focus state detection images output from the two photoelectric converters increases and the focus state detection accuracy increases.

Reference numeral 1000 denotes the designed distribution of received light on the pupil of the photographing lens 5 of a normal imaging pixel shown in the partial plan view of the image sensor 10 in FIG. 8. The normal imaging pixel is configured so as not to prevent transmittance of light to the photoelectric converter with a light shielding layer such as tungsten. Hence, the photoelectric converter of the normal imaging pixel can receive light beams transmitted through the entire pupil area $S\gamma$ of the photographing lens 5.

It should be noted that the above explanation is on the focus state detection pixels whose photoelectric converters are divided in the x-axis direction, the same explanation can be applied to the focus state detection pixels whose photoelectric converters are divided in the y-axis direction as shown in FIG. 8.

As described above, according to the second embodiment, the photoelectric converters of focus state detection pixels have any one of six kinds of configurations in which the center of gravity of the distribution of received light is present on the x-axis or y-axis. Thus, even if a misalignment occurs between a microlens and a photoelectric converter of the image sensor 10, focus state detection is possible with one of the focus state detection pixel groups.

Although an example has been described in which the image sensor 10 of this second embodiment is composed by focus state detection pixels and normal imaging pixels, a configuration may also be adopted in which the image sensor 10 is composed by only focus state detection pixel groups having three kinds of distribution of received light in which the center of gravity of the distribution of received light of each photoelectric converter is present on each of the x-axis and y-axis. In such case, when imaging a normal image, an image can be generated by adding together the outputs of photoelectric converters with different distributions of received light.

Further, according to the focus state detection pixel in the first embodiment, the aperture is formed by a light shielding layer that prevents transmittance of one part of light to the photoelectric converter using an electrode. According to the focus state detection pixel in the second embodiment, the aperture is formed by a light shielding layer that prevents transmittance of one part of light to the photoelectric converter using tungsten. In this regard, the methods of shielding light may be reversed with respect to the first embodiment and the second embodiment. In this connection, the method of shielding light using tungsten that is described in the second embodiment can shield light at a location that is closer to the photoelectric converter than in the case of an electrode. Therefore, the method of shielding light using tungsten that is described in the second embodiment is more favorable because image-forming positions of a normal imaging pixel and a focus state detection pixel are closer than in the case of the method that uses an electrode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-302906, filed on Nov. 27, 2008 which is hereby incorporated by reference herein in its entirety.

The invention claimed is:

1. An image sensing element that outputs signals of images for performing a correlation calculation to detect a focus state of a photographing lens, the image sensing element comprising:
   a first pixel line configured to include a first plurality of focus state detection pixels, each of the first plurality of focus state detection pixels having a separate aperture shifted by a first amount from a center of each pixel, arranged in a direction of the shift;
   a second pixel line configured to include a second plurality of focus state detection pixels, each of the second plurality of focus state detection pixels having a separate aperture shifted by a second amount in each pixel with respect to a position, in each pixel, of the aperture of a corresponding one of the first plurality of focus state detection pixels, arranged in the direction of the shift;
   a third pixel line configured to include a third plurality of focus state detection pixels, each of the third plurality of focus state detection pixels having a separate aperture shifted by a third amount in each pixel with respect to the position, in each pixel, of the aperture of a corresponding one of the first plurality of focus state detection pixels, arranged in the direction of the shift; and
   a fourth pixel line configured to include a fourth plurality of focus state detection pixels, each of the fourth plurality of focus state detection pixels having a separate aperture shifted by a fourth amount in each pixel with respect to a position, in each pixel, of the aperture of a corresponding one of the second plurality of focus state detection pixels, arranged in the direction of the shift,
   wherein the first plurality of focus state detection pixels and the second plurality of focus state detection pixels form images, respectively, which are used for the correlation calculation,
   wherein the third plurality of focus state detection pixels and the fourth plurality of focus state detection pixels form images, respectively, which are used for the correlation calculation, and
   wherein the first, second, and third amounts, or the first, second, and fourth amounts are different from one another.

2. The image sensing element according to claim 1, wherein the plurality of first focus state detection pixels and the plurality of second focus state detection pixels are covered by light shielding members having the plurality of apertures of the first plurality of focus state detection pixels and the plurality of apertures of the second plurality of focus state detection pixels at positions that respectively allow a plurality of light beams to pass through.

3. The image sensing element according to claim 1, further comprising:
   a fifth pixel line configured to include a fifth plurality of focus state detection pixels, each of the fifth plurality of focus state detection pixels having a separate aperture shifted by a fifth amount in each pixel with respect to the position, in each pixel, of the aperture of a corresponding one of the first plurality of focus state detection pixels, arranged in the direction of the shift; and
   a sixth pixel line configured to include a sixth plurality of focus state detection pixels, each of the sixth plurality of focus state detection pixels having a separate aperture shifted by a sixth amount in each pixel with respect to the position, in each pixel, of the aperture of a corresponding one of the second plurality of focus state detection pixels, arranged in the direction of the shift,
   wherein the fifth plurality of focus state detection pixels and the sixth plurality of focus state detection pixels form images, respectively, which are used for the correlation calculation, and receive light beams passed through third pupil areas, which are shifted by a predetermined amount from first pupil areas that transmit a pair of light beams that the first focus state detection pixels receive, and which are different from second pupil areas that transmit a pair of light beams that the second focus state detection pixels receive, and
   wherein the first pupil areas and the second pupil areas are arranged at symmetric positions with respect to the third pupil areas.

4. The image sensing element according to claim 1, wherein each of the first and second pluralities of apertures of the first plurality of focus state detection pixels and the second plurality of focus state detection pixels has, in each pixel of the first and second focus state detection pixels, a light shielding layer that prevents transmittance of a part of light to a photoelectric converter.

5. The image sensing element according to claim 1,
   wherein the image sensing element is provided on an image forming plane of a photographing lens, and
   wherein the image sensing element is incorporated in an image sensing apparatus that includes:
      a calculator configured to, based on positions of light-receiving areas of the first and second focus state detection pixel pairs in the respective pixels, positions of the first and second focus state detection pixel pairs in the image sensing element, and information on the photographing lens:
         calculate a first ratio of an area on a first pupil of the photographing lens corresponding to the aperture of each of the first plurality of focus state detection pixels to an area on a second pupil of the photographing lens corresponding to the aperture of each of the second plurality of focus state detection pixels, and calculate a second ratio of an area on a third pupil of the photographing lens corresponding to the aperture of each of the third plurality of focus state detection pixels to an area on a fourth pupil of the photographing lens corresponding to the aperture of each of the fourth plurality of focus state detection pixels;

a detector configured to detect a focus state using a signal that is output from a focus state detection pixel pair for which the first or second ratio calculated by the calculation unit is within a predetermined range; and a controller configured to control the photographing lens based on the focus state that is detected by the detector.

6. The image sensing element according to claim 1, wherein the third and fourth amounts are the same.

7. The image sensing element according to claim 3, wherein the fifth and sixth amounts are the same.

* * * * *